(12) United States Patent
Plasterer

(10) Patent No.: US 9,853,007 B2
(45) Date of Patent: Dec. 26, 2017

(54) METHOD FOR PRODUCING AN INTEGRATED CIRCUIT PACKAGE AND APPARATUS PRODUCED THEREBY

(71) Applicant: Microsemi Solutions (U.S.), Inc., Aliso Viejo, CA (US)

(72) Inventor: John Plasterer, Port Coquitlam (CA)

(73) Assignee: MICROSEMI SOLUTIONS (U.S.), INC., Aliso Viejo, CA (US)

( * ) Notice: Subject to any disclaimer, the term of this patent is extended or adjusted under 35 U.S.C. 154(b) by 88 days.

(21) Appl. No.: 14/926,709

(22) Filed: Oct. 29, 2015

(65) Prior Publication Data

US 2016/0190084 A1 Jun. 30, 2016

Related U.S. Application Data

(60) Provisional application No. 62/097,724, filed on Dec. 30, 2014.

(51) Int. Cl.
| | | |
|---|---|---|
| *G06F 17/50* | (2006.01) | |
| *H01L 23/00* | (2006.01) | |
| *H01L 21/66* | (2006.01) | |
| *H01L 23/498* | (2006.01) | |

(52) U.S. Cl.
CPC ............. *H01L 24/17* (2013.01); *H01L 22/32* (2013.01); *H01L 23/49827* (2013.01); *H01L 23/49838* (2013.01); *H01L 2224/13025* (2013.01); *H01L 2224/16055* (2013.01); *H01L 2224/16057* (2013.01); *H01L 2224/17132* (2013.01)

(58) Field of Classification Search
CPC ....... H05K 2201/10734; H05K 3/3436; H05K 1/0268; H05K 2201/10378; H05K 2201/10674; H05K 3/4007; H05K 2201/09809; G01R 31/2851; G01R 31/2856; G01R 31/2863; G01R 31/2884; G01R 31/2896; G01R 31/3171
USPC ................. 257/734–738, E23.069, E23.021
See application file for complete search history.

(56) References Cited

U.S. PATENT DOCUMENTS

| | | | |
|---|---|---|---|
| 6,040,530 A * | 3/2000 | Wharton | G01R 31/316 174/261 |
| 6,285,560 B1 | 9/2001 | Lyne | |
| 7,400,134 B2 * | 7/2008 | Morishita | G01R 31/31701 257/48 |

(Continued)

*Primary Examiner* — Nghia Doan
(74) *Attorney, Agent, or Firm* — Leber IP Law; Dennis R. Hazko

(57) ABSTRACT

A processor-implemented method and integrated circuit package are provided. According to an implementation, a method of producing a chip package includes de-populating solder balls at selected locations in a fine pitch package, and providing test pads at the de-populated solder ball locations. In an example implementation, the method comprises receiving and modifying a package design. In an implementation, a row of test pads in an integrated circuit package is provided in a plurality of concentric annular rows, the row of test pads being adjacent an outer row of via-connected solder balls and adjacent an inner row of via-connected solder balls. In an implementation, test pads are located on a PCB-facing surface of the package at a subset of locations opposing at least one via position on a package-facing surface of the PCB. The test pads maintain a large number of signal pins and do not interfere with the via.

10 Claims, 13 Drawing Sheets

(56) References Cited

U.S. PATENT DOCUMENTS

| | | | |
|---|---|---|---|
| 9,110,128 B1* | 8/2015 | Long | G01R 31/2863 |
| 2003/0011071 A1* | 1/2003 | Kariyazaki | H01L 23/50 |
| | | | 257/737 |
| 2009/0160475 A1* | 6/2009 | Ali | G01R 31/2884 |
| | | | 324/750.03 |
| 2011/0260309 A1 | 10/2011 | Lee | |
| 2013/0062763 A1 | 3/2013 | Chan et al. | |

* cited by examiner

METHOD FOR PRODUCING AN INTEGRATED CIRCUIT PACKAGE AND APPARATUS PRODUCED THEREBY

CROSS-REFERENCE

This application claims priority to provisional application U.S. Patent Application Ser. No. 62/097,724 filed on Dec. 30, 2014, which is hereby incorporated by reference.

FIELD

The present disclosure relates to manufacturing of integrated circuits, including but not limited to producing an integrated circuit package.

BACKGROUND

Semiconductor device fabrication typically includes a final stage of encasing or encapsulating the integrated circuit into a supporting case or package.

In some implementations, such as a ball grid array (BGA) surface-mount packaging for integrated circuits, it is desirable to provide an integrated circuit package that has reduced size and a reduced BGA pitch. A pitch refers to a relative spacing between solder balls. The solder balls can include one or more of signal balls, ground balls, and power balls. The solder balls connect the integrated circuit package to a printed circuit board (PCB).

Improvements in integrated circuit packaging are desirable.

BRIEF DESCRIPTION OF THE DRAWINGS

Embodiments of the present disclosure will now be described, by way of example only, with reference to the attached Figures.

DETAILED DESCRIPTION

Figure 1A:
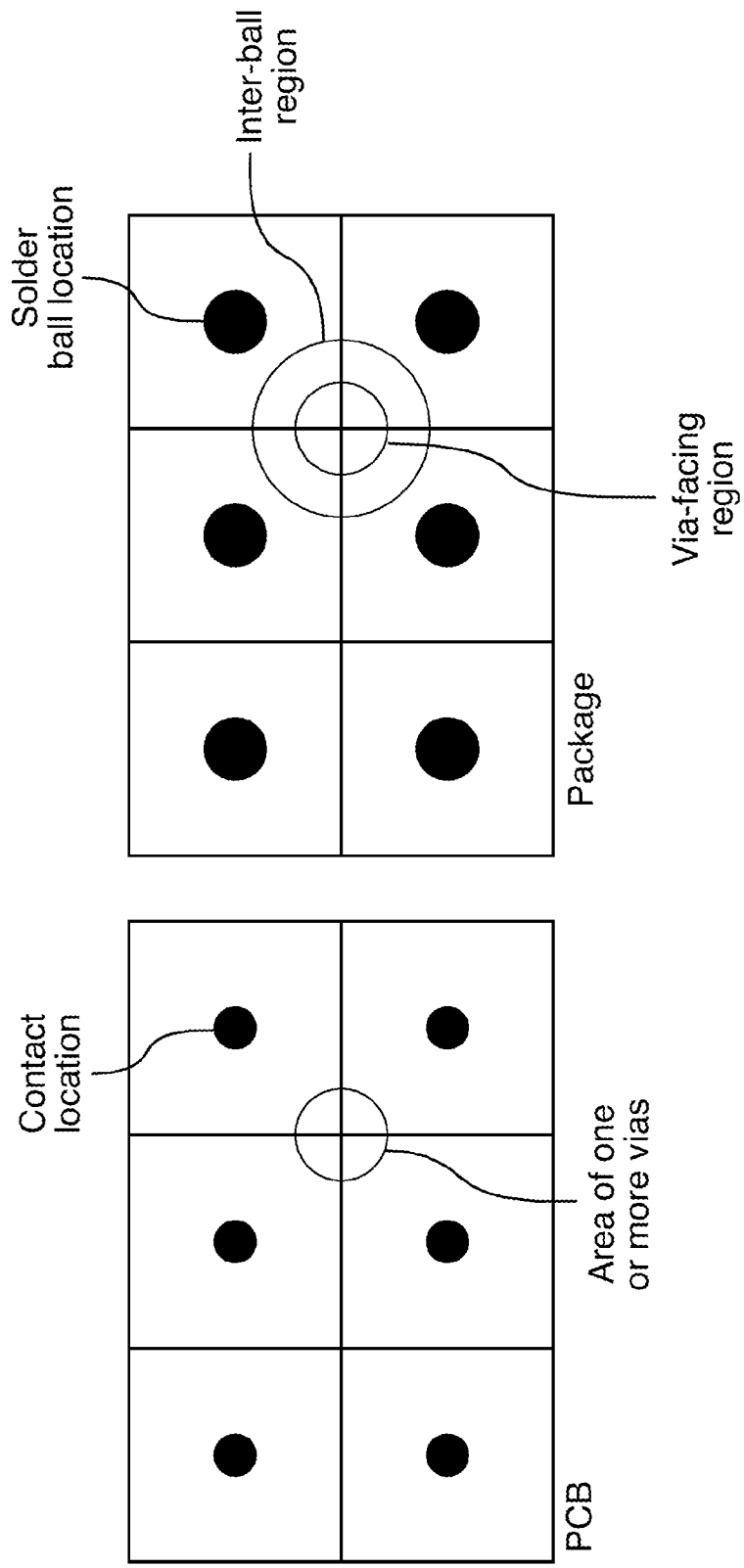
FIGS. 1A, 1B and 1C illustrate simplified representative views of known large, medium and fine pitch BGA layouts, respectively.

A processor-implemented method and integrated circuit package are provided. According to an implementation, a method of producing a chip package includes de-populating solder ball locations at selected locations in a fine pitch width package, and providing test pads at the de-populated ball locations. In an example implementation, the method comprises receiving and modifying a package design. In an implementation, a row of test pads in an integrated circuit package is provided in a plurality of concentric annular rows, the row of test pads being adjacent an outer row of balls and adjacent an inner row of balls. In an implementation, test pads are located on a PCB-facing surface of the package at a subset of de-populated ball locations opposing at least one via on a package-facing surface of the PCB. The test pads maintain a large number of signal pins and do not interfere with the via.

According to an embodiment the present disclosure, a method of producing an integrated circuit package for connecting to a printed circuit board is provided, and the method comprises: receiving an initial fine pitch integrated circuit package design defined with respect to a grid having a plurality of ball locations; identifying one or more de-population locations in the initial design, the de-population locations corresponding to a subset of the plurality of ball locations and having solder balls assigned thereto in the initial design, the initial design defining an initial inter-ball region between adjacent first and second solder balls in the one or more de-population locations, the initial inter-ball region being smaller than a via-facing region; modifying the initial design to insert, at a selected de-population location in the one or more de-population locations, a test pad instead of the second solder ball to produce a modified fine pitch integrated circuit package design, the modified design defining, based on removal of the second solder ball from the selected de-population location, a modified inter-ball region between the first solder ball and an adjacent third solder ball, the modified inter-ball region being greater than the via-facing region and greater than the initial inter-ball region.

In a further embodiment, the via-facing region is defined by an area on the initial design of the package, wherein the area is opposite a location of one or more vias located on the printed circuit board when the package is connected to the printed circuit board.

In a further embodiment, the initial fine pitch integrated circuit package design comprises a fully populated fine pitch integrated circuit package design.

In a further embodiment, the plurality of ball locations are arranged in a plurality of concentric annular rows, the at least one test pad comprises a plurality of test pads, and wherein modifying the integrated circuit package to produce the modified integrated circuit package design comprises: producing a row of test pads in the plurality of concentric annular rows, the row of test pads being produced adjacent an outer row of balls and adjacent an inner row of balls, the row of test pads comprising the plurality of test pads.

In a further embodiment, the outer row and the inner row comprise ground balls, power balls or signal balls.

In a further embodiment, the inner rows comprise alternating ground balls, power balls, and signal balls in order to increase coupling between the ground balls, the power balls, and the signal balls and reduce overall inductance.

In a further embodiment, the method further comprises: producing a second row of test pads in the plurality of concentric annular rows, the second row of test pads being produced adjacent a second inner row of balls and adjacent a second outer row of balls, the second row of test pads comprising a second plurality of test pads.

In a further embodiment, the method further comprises: producing a plurality of rows of test pads in the plurality of concentric annular rows, the plurality of rows of test pads being produced every third row such that each row of test pads is adjacent an inner row of balls and adjacent an outer row of balls, each of the plurality of rows of test pads comprising a set of test pads.

In a further embodiment, the plurality of concentric annular rows comprises first, second, third and fourth rows, the first row being closest to an outer perimeter of the integrated circuit package, and the second, third and fourth rows being increasingly farther from the outer perimeter of the package, the first and second rows each comprising a plurality of signal balls, the third row comprising one or more of power, ground or signal balls, and the fourth row comprising the one or more test pads in the one or more depopulation locations.

In a further embodiment, the row of test pads in the plurality of concentric annular rows comprises a plurality of concentric square boxes.

In a further embodiment, the row of test pads in the plurality of concentric annular rows comprises a plurality of concentric rectangular boxes.

According to an embodiment the present disclosure, an integrated circuit package having a fine pitch integrated circuit package design defined with respect to a grid having a plurality of ball locations arranged in a plurality of concentric annular rows is provided, the integrated circuit package for connecting to a printed circuit board, and the package comprises: an outer row of via-connected solder balls in the plurality of concentric annular rows; an inner row of via-connected solder balls in the plurality of concentric annular rows; and a row of test pads in the plurality of concentric annular rows, the row of test pads being adjacent the outer row of via-connected solder balls and adjacent the inner row of via-connected solder balls, the row of test pads comprising a plurality of test pads, and the outer and inner rows of via-connected solder balls each connected to vias of the printed circuit board when the package is connected to the printed circuit board.

In a further embodiment, a test pad of the row of test pads is opposite a location of one or more vias located on the printed circuit board when the package is connected to the printed circuit board.

In a further embodiment, the row of test pads further comprises at least one via-connected solder ball.

In a further embodiment, the row of test pads further comprises at least one power, signal, or ground ball.

In a further embodiment, the row of test pads further comprises at least one de-populated ball location.

In a further embodiment, the row of test pads in the plurality of concentric annular rows comprises a square box.

In a further embodiment, the row of test pads in the plurality of concentric annular rows comprises a rectangular box.

In a further embodiment, the plurality of test pads are provided in a ring-like configuration.

In a further embodiment, the plurality of test pads in the row of test pads have a first pitch different than a second pitch of the outer and inner rows of via-connected solder balls.

In a further embodiment, the plurality of concentric annular rows comprises first, second, third, fourth and fifth rows, the first row being closest to an outer perimeter of the integrated circuit package, and the second, third, fourth and fifth rows being increasingly farther from the outer perimeter of the package, the first and second rows each comprising a plurality of signal balls, the fourth row comprising the row of test pads; the third row comprising the outer row of via-connected solder balls; and the fifth row comprising the inner row of via-connected solder balls.

According to an embodiment the present disclosure, an apparatus is provided and comprises: a printed circuit board (PCB) comprising a package-facing surface, the package-facing surface defining a regular pattern of repeating locations comprising first and second subsets of locations, the first subset of locations each comprising a contact, and the second subset of locations comprising a via area, the PCB comprising at least one via provided in one of the via areas, the via having a first end terminating at the package-facing surface; and an integrated circuit package having a fine pitch integrated circuit package design defined with respect to a package grid on a PCB-facing surface of the package, the package grid defining a regular pattern of repeating locations comprising third and fourth subsets of locations, the third subset of locations each comprising a solder ball, and the fourth subset of locations comprising a test pad, the first and second subset of locations located opposite the third and fourth subset of locations, respectively, when the package-facing surface of the PCB is mounted to the PCB-facing surface of the package.

In a further embodiment, the contacts of the first subset of locations are connected to the solder balls of the third subset of locations, and the via areas of the second subset of space are disconnected from the test pads of the fourth subset of locations.

In a further embodiment, the apparatus further comprises the test device comprising a test socket having a package-facing surface defining a regular pattern of repeating spaces, comprising a fifth subset of spaces each comprising a test pin; the fifth subset of spaces located opposite to the fourth subset of spaces when the package-facing surface of the test socket is mounted to the PCB-facing surface of the package; and the test pins of the fifth subset of spaces are connected to the test pads of the fourth subset of spaces.

In a further embodiment, the PCB grid and the package grid each define a rectangular pattern of repeating locations.

In a further embodiment, the PCB grid and the package grid each define a staggered pattern of repeating locations.

According to an embodiment the present disclosure, an apparatus is provided and comprises: an integrated circuit package having a fine pitch integrated circuit package design defined with respect to a grid having a plurality of ball locations, the integrated circuit package comprising a printed circuit board (PCB)-facing surface; solder balls located at a first subset of ball locations on the PCB-facing surface, the solder balls including first and second solder balls defining a first inter-ball region there between, the inter-ball region having an area less than a via-facing region; and test pads located at a second subset of the ball locations on the PCB-facing surface, the test pads defining a second inter-ball region there between, the second inter-ball region having an area greater than the via-facing region.

In a further embodiment, the test pads are provided in a ring-like configuration.

In a further embodiment, the plurality of ball locations are arranged in a plurality of concentric annular rows, and wherein the test pads are provided in an annular row of test pads in the plurality of concentric annular rows.

In a further embodiment, the test pads occupy a subset of a plurality of balls locations in the annular row of test pads.

Numerous details are set forth to provide an understanding of the embodiments described herein. The embodiments may be practiced without these details. In other instances, well-known methods, procedures, and components have not been described in detail to avoid obscuring the embodiments described.

Example embodiments of the present disclosure comprise a method of producing a package having a reduced body size and reduced test time. In other example embodiments, a method is provided for reducing body size and reducing test time in a package-on-package (PoP) environment. Other example embodiments comprise a package produced in accordance with one of the methods described herein.

In a reduced body size package, it is desirable to also reduce the ball grid array (BGA) pitch. Reducing the pitch allows the package size to be reduced while also maintaining a large number of signal pins. Reducing the number of signal pins reduces the I/O throughput, and the features and capabilities of the device; therefore, it is advantageous to reduce pitch when reducing package size.

Figure 1B:
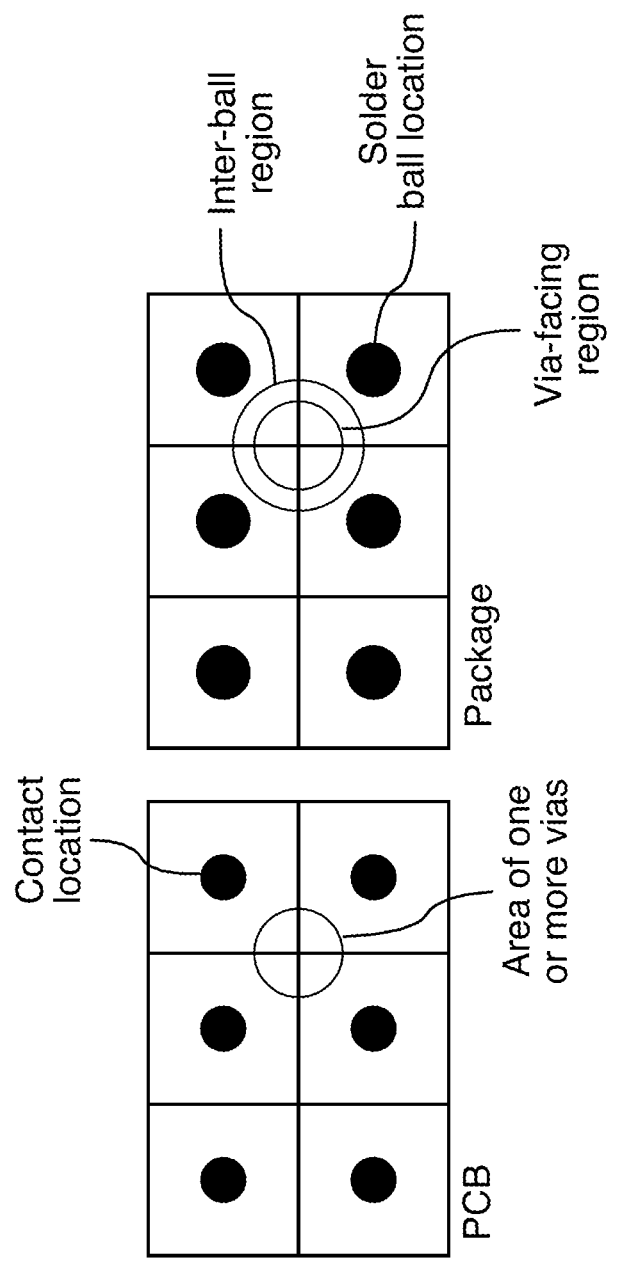

However, reducing pitch imposes additional design constraints on the packaging and PCB layout. For example, vias are typically placed on the PCB adjacent to the PCB connections to the solder balls of the integrated circuit package. FIGS. 1A and 1B illustrate simplified representative views of known large and medium pitch BGA layouts, respectively, each including a package and a PCB. The package includes a plurality of ball locations, each ball location including therein a solder ball. An inter-ball region is defined between each of the solder balls. In both the large and medium pitch examples of FIGS. 1A and 1B, the inter-ball region is larger than the dimensions of a via-facing region, the dimensions being defined by an area of one or more vias. When the inter-ball region is larger than the via-facing region, the one or more vias can be placed on a PCB and the PCB can be connected to the package. If the inter-ball region is smaller than the dimensions of the via-facing region, one or more solder balls may touch one or more vias on the PCB when the package is connected to the PCB, which is an undesirable situation.

Figure 1C:
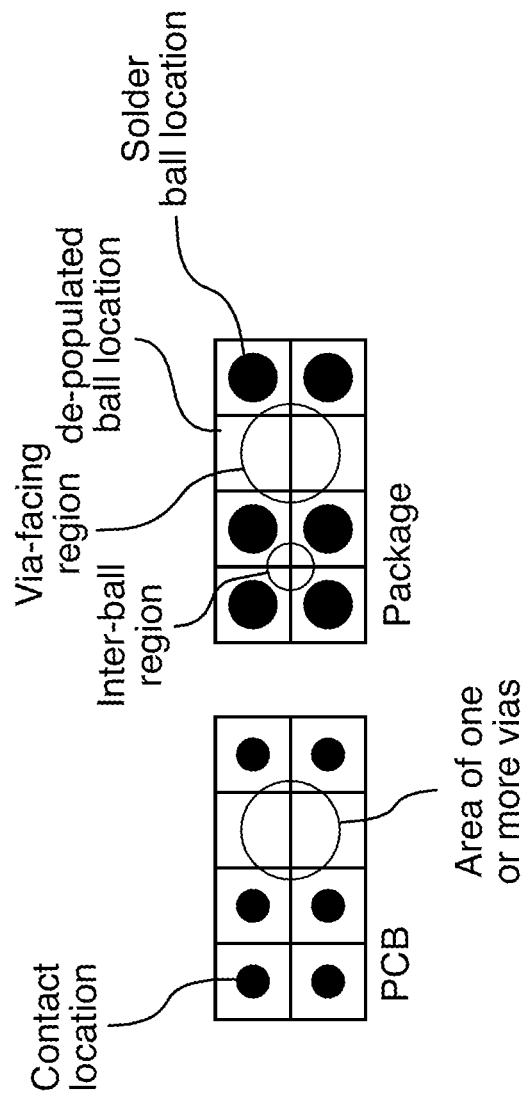

In a known simplified fine pitch BGA layout, as shown in FIG. 1C, the via-facing region may have dimensions larger than the inter-ball regions. In an embodiment, the via-facing region is defined by an area of two vias connected by a surface mount component, such as resistor or capacitor, and additional spacing between the two vias and adjacent contacts on the PCB.

Therefore, in a conventional reduced-size package having a fine pitch, some of the ball locations on the BGA may be de-populated or removed, leaving an empty space large enough for the via-facing region. In an example embodiment, the via-facing region is 19 mils (approximately 0.48 mm) for current PCB technology, the BGA pitch is approximately 0.65 mm, and the ball pad diameter is approximately 0.4 to 0.45 mm; therefore, the inter-ball region is smaller than the via-facing region.

It is also possible to reduce the size of the chip package by reducing a number of test signal connections. This slows down the test time because test signals are more serialized.

Therefore, small body size packages have two key constraints: very few signal connections, which limits testability and increases test times; and tight ball pitches, which typically require PCB rules that are expensive to implement. In some cases, the PCB rules necessary for routing tight ball pitches are prohibitively expensive such that the financial cost of implementing an integrated chip package excludes the use of the integrated chip package.

Embodiments of the present disclosure provide a method to maintain test coverage while clearing space on the PCB for increased routability. Routability refers to the ability to escape signals and powers for the ball grid array. The term "escape" in this context represents the ability to route the signals from a BGA area to the appropriate components. A package with better routability will be escapable on a minimal number of PCB layers.

Figure 2:
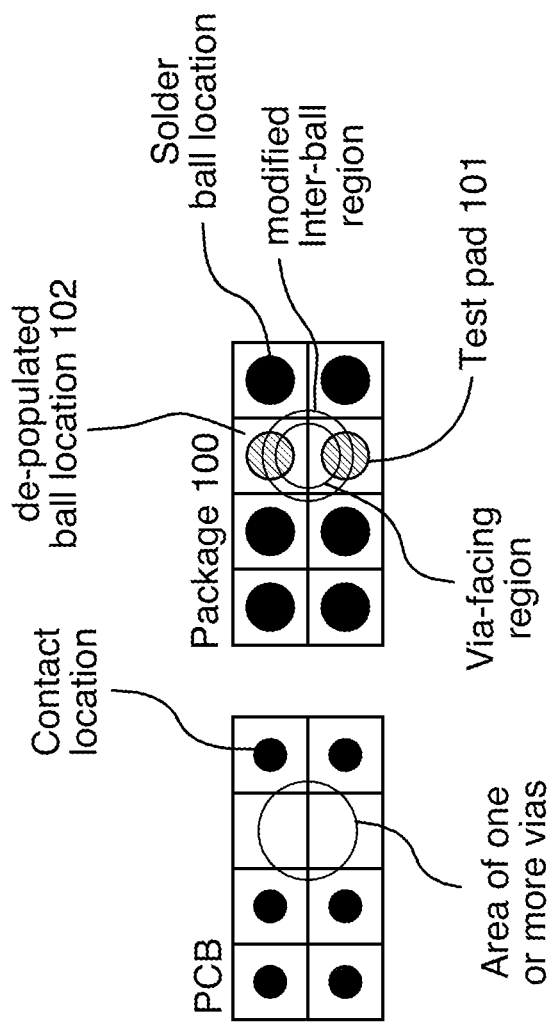
FIG. 2 illustrates a simplified representative view of an integrated circuit package layout according to an embodiment of the present disclosure.

FIG. 2 shows an example embodiment of the present disclosure, in which a package 100 includes test pads 101 placed at de-populated ball locations 102. The test pads 101 advantageously occupy package space that would otherwise be wasted from de-population; furthermore, the test pads 101 mitigate the need to replace signal balls with test balls. An additional benefit is that the test pads 101 allow for greater test signal throughput, leading to reduced test times.

When the package is configured for operation with the PCB, the solder balls of the package are connected to the contacts of the PCB, while the test pads of the package are disconnected from (i.e., not touching or interfering with) the vias of the PCB.

When the package is configured for testing with a test device, such as a socketed production test environment, the test pads are engaged with connectors, such as spring loaded connectors or pogo pins. In an example embodiment, the test pads are provided in spaces created by the depopulated ball locations and form, substantially, a ring between a number of outer rows of balls (typically where the signal and power balls are located) and the center balls (typically where the ground and power balls are located).

Figure 3:
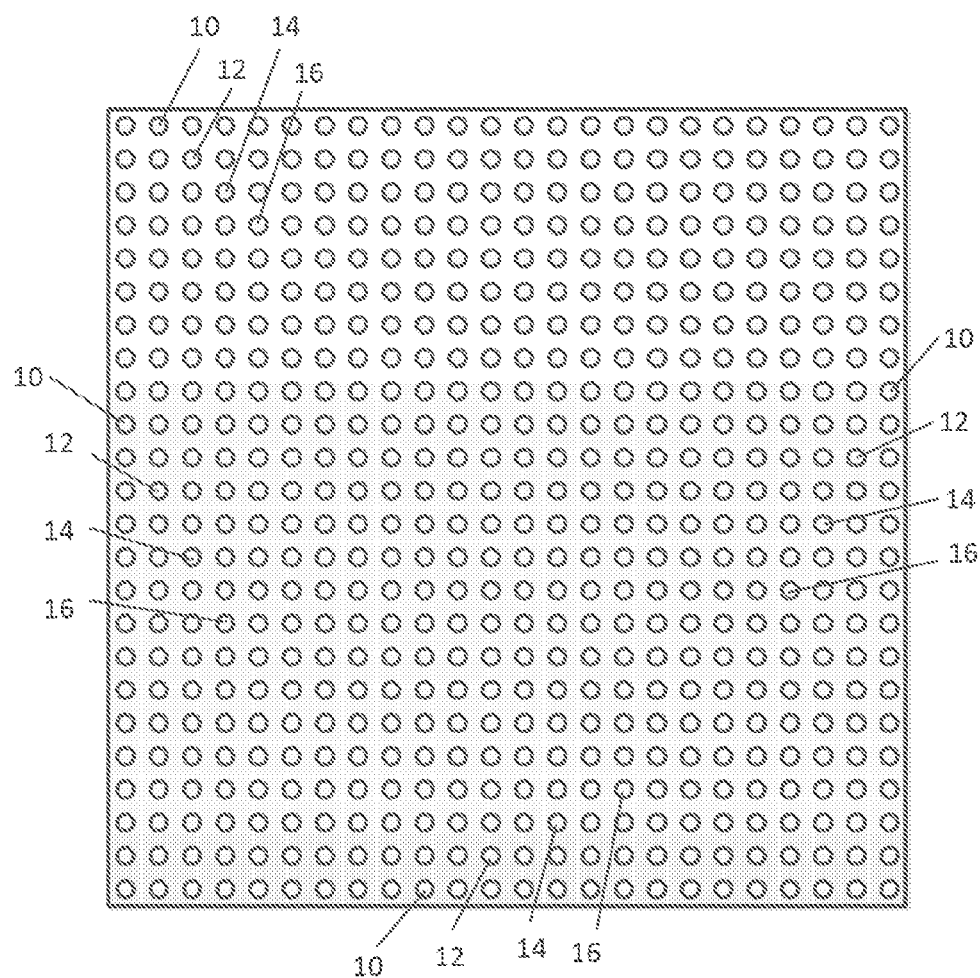
FIG. 3 illustrates a known fully populated ball grid array.

FIG. 3 illustrates a known fully populated ball grid array. The ball grid array of FIG. 3 can be referred to as an integrated circuit package design defined with respect to a grid. In an example embodiment, the ball grid array comprises a fine pitch integrated circuit package design. The grid includes a plurality of solder ball locations arranged in a plurality of concentric annular rows, for example in concentric rectangles or squares as shown in FIG. 3. In FIG. 3, each of the circles represents a ball location, each of which is populated with a solder ball. In an example embodiment, the plurality of concentric annular rows in the grid comprises first, second, third and fourth rows, etc. For example, a first annular row comprises a first plurality of ball locations 10 that are closest to an outer perimeter of the integrated circuit package, and includes ball locations adjacent every outer edge of the package. The second, third and fourth concentric annular rows are increasingly farther from the outer perimeter of the package, and comprise a plurality of ball locations 12, 14 and 16, respectively.

Figure 4:
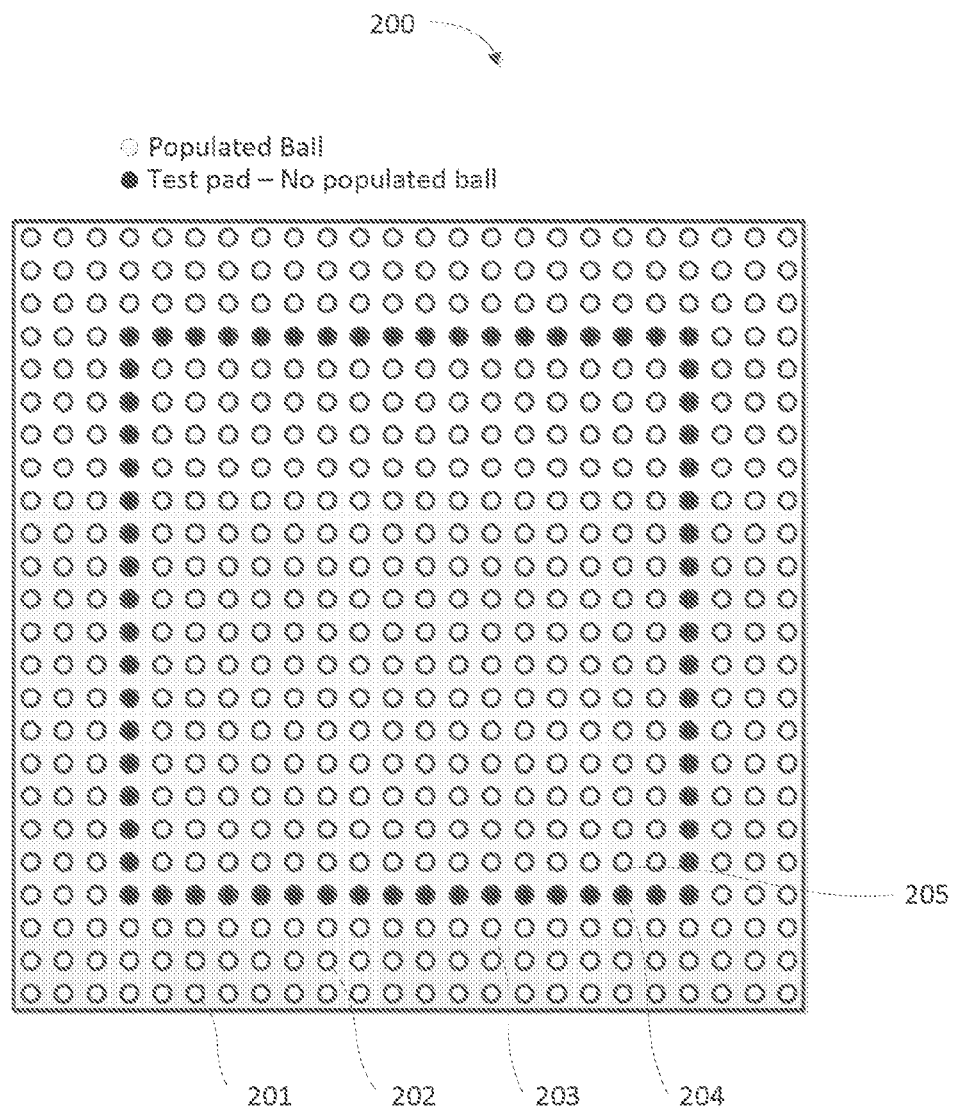
FIG. 4 illustrates an integrated circuit package including a ball grid array according an embodiment of the present disclosure.

FIG. 4 illustrates an integrated circuit package 200 including a ball grid array according an embodiment of the present disclosure. FIG. 4 illustrates depopulating the 4th row 204 from the outer edge in an initially fully populated integrated circuit package layout. According to an embodiment, some or all of the depopulated ball locations are populated with test pads. Having little or no population of balls on the 4th row, which can be described as a fully or partially depopulated row, allows signals to escape on the PCB. Specifically, vias located on the 4th row 204 of the PCB are used to escape signals from rows 3 203 and 5 205 of the PCB; therefore, solder balls from rows 3 and 5 of the package or connected to contacts from rows 3 and 5 of the PCB, which are each in turn connected to the vias located on the 4th row of the PCB. According to this configuration, signals coupled from the package (on rows 3 and 5) to the PCB (on rows 3 and 5) may be escaped from the PCB through the vias on row 4.

As shown in the example embodiment of FIG. 4, the present disclosure provides an integrated circuit package having a fine pitch integrated circuit package design defined with respect to a grid having a plurality of ball locations arranged in a plurality of concentric annular rows. The integrated circuit package comprises an outer row of via-connected solder balls and an inner row of via-connected solder balls in the plurality of concentric annular rows. The via-connected solder balls are connected to PCB vias when the package is connected to a PCB. The outer and inner rows of via-connected solder balls of the package may comprise power, signal, or ground solder balls. The power, signal, or ground solder balls are connected either to a power circuit, to a signal, or to a ground circuit. The package further comprises a row of test pads in the plurality of concentric annular rows. The row of test pads is adjacent the outer row of via-connected solder balls and adjacent the inner row of via-connected solder balls. The row of test pads comprises a plurality of test pads.

Figure 5:
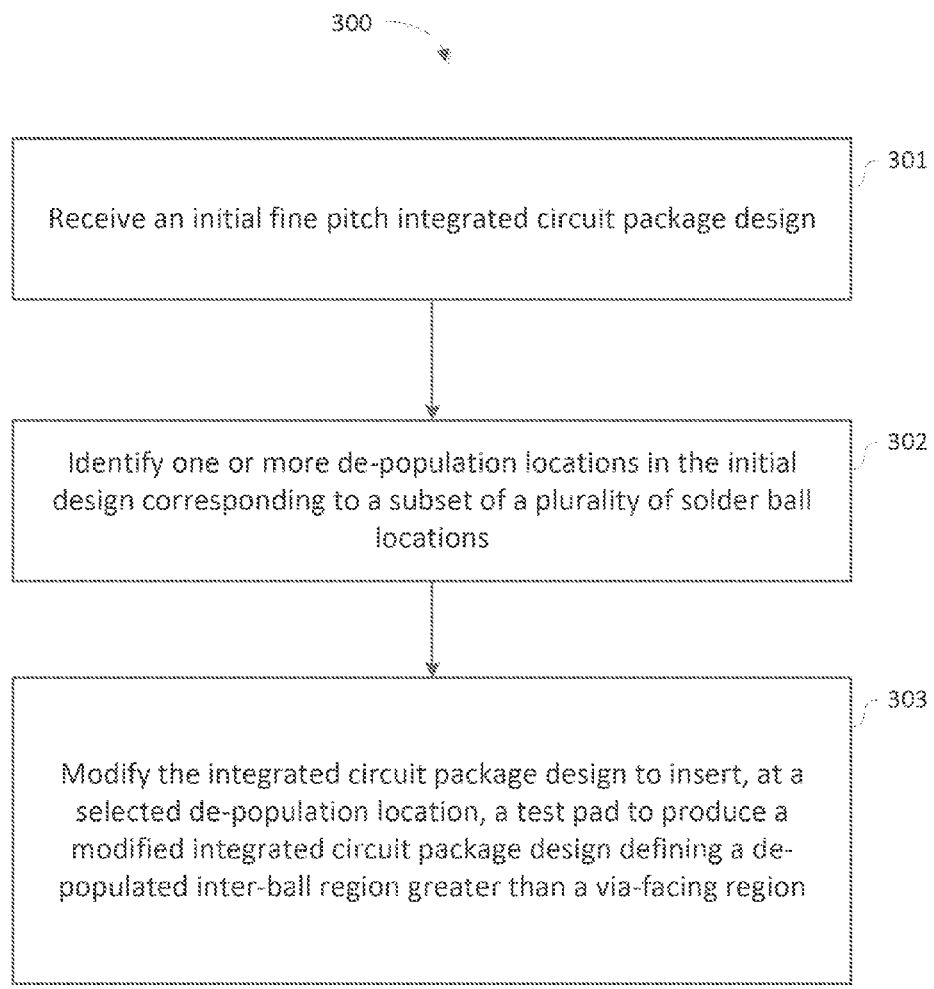
FIG. 5 is a flowchart illustrating a processor-implemented method of producing an integrated circuit package according to an embodiment of the present disclosure.

FIG. 5 is a flowchart illustrating a processor-implemented method 300 of producing an integrated circuit package for connecting to a printed circuit board, according to an embodiment of the present disclosure. In an example embodiment, the method of producing an integrated circuit package is a processor-implemented method. The processor-implemented method comprises, at 301, receiving an initial fine pitch integrated circuit package design defined with respect to a grid having a plurality of ball locations arranged in a plurality of concentric annular rows. In an example embodiment, the processor-implemented method comprises receiving a fully populated fine pitch integrated circuit package design. The processor-implemented method also comprises, at 302, identifying one or more de-population locations in the received design. The de-population locations correspond to a subset of the plurality of ball locations and have solder balls assigned thereto in the initial design. The initial design defines an inter-ball region between adjacent first and second solder balls in the one or more de-population locations, the inter-ball region being smaller than a via-facing region.

In an embodiment, the via-facing region is defined by an area on the initial design of the package. The area is opposite a location of one or more vias located on the printed circuit board when the package is connected to the printed circuit board.

The processor-implemented method further comprises, at 303, modifying the integrated circuit package design to insert, at a selected de-population location in the one or more de-population locations, a test pad instead of the second solder ball, to produce a modified integrated circuit package design. The modified integrated circuit package design defines, based on removal of the second solder ball from the selected de-population location, a de-populated inter-ball region between the first solder ball and an adjacent third solder ball. The de-populated inter-ball region is greater than the via-facing region.

In an example embodiment, solder balls are de-populated from the initial package design in a substantially-ring-like configuration in the BGA, for example by de-populating one or more solder ball locations in a concentric annular row, or ring-like configuration. In the depopulated solder ball locations, the solder balls are replaced by test pads in the substantially-ring-like configuration in the BGA, to allow the chip to be tested in a socketed production test environment with probe pins. In an example embodiment of a chip package, the test pads are located in the substantially-ring-like configuration at the 4th row from the outside edge of the package; this generally delimits the majority signal and power solder balls near the edge of the BGA, from the majority ground (GND) and power solder balls near the center of the BGA.

The substantially-ring-like configuration provides advantages to the chip package. For example, the pitch of chip may be reduced so that the overall package size can be reduced while keeping substantially the same number of test connections relative to a larger chip package. When the pitch of the chip and the corresponding PCB grid is reduced, some of the signals on the PBC are routed through the layers of the PCB using vias. In this example, the vias are arranged in a substantially-ring-like configuration. Therefore, the package comprises an opposing substantially-ring-like configuration of test pads in order to achieve a substantially similar number of test connections relative to a larger chip package.

In an example embodiment, a package comprises a 196-pin flip chip ball grid array (FCBGA), 10 mm×10 mm at 0.65 mm ball-pitch.

Reducing the pitch of the integrated circuit package requires more expensive PCB processes in order to reduce the size and pitch of PCB vias used for escaping signals on the PCB. If less expensive PCB processes are used, then the via area may interfere with solder ball contacts on the PCB grid. However, if solder ball contacts are removed from the PCB, causing corresponding solder balls on the package grid to be de-populated, then space can be made for the via on the existing real estate on the PCB grid, thereby increasing the component density of the PCB (i.e., increasing the number of integrated circuit packages and other physical components that can be mounted to a PCB).

Embodiments of the present disclosure take advantage of the wasted space that these de-populated areas would otherwise encompass. Advantageously, an embodiment includes test pads provided at these de-populated areas in order to keep the number of test signal connections relatively high while reducing the size of the package. In an example embodiment, the de-population locations are ball locations in a grid of a ball grid array that would otherwise have been populated by solder balls, as opposed to spaces in between or around the ball locations in the grid.

In an example embodiment, rectangular surface mount components, for example capacitors and resistors, are mounted to the PCB surface opposite the PCB grid surface facing the package. Vias are vertical signal paths carried through layers of the PCB. Traces are horizontal signal paths on the PCB connecting circular solder connection locations, surface mount components, and vias, within a layer of the PCB.

To isolate signal traces from ground traces, in an embodiment, the underside (the side opposite the PCB grid facing the package) of the PCB will have surface-mount capacitors and resistors at the locations near the GND balls near the center of the package. These surface-mount components are connected to the PCB by vias, which route through multiple layers of the PCB. Therefore, the vias may be located on the PCB opposite the package. In a conventional package there is enough space between the ball locations to clear the vias. However, in a fine pitch package, there is not enough space;

therefore many of the balls in substantially-ring-like area must be depopulated, and optionally relocated, to make space for the vias.

In an example embodiment, the test pads are provided in a ring-like configuration. In an example embodiment, the plurality of ball locations are arranged in a plurality of concentric annular rows, and the test pads are provided in an annular row of test pads in the plurality of concentric annular rows. In an example embodiment, the test pads occupy a subset of a plurality of ball locations in the annular row of test pads. In another embodiment, the test pads occupy all of the ball locations in the annular row of test pads.

In an embodiment, a method of depopulating the solder balls of BGA 200 comprises identifying that the first two rows of balls 201 and 202 can be escaped on the top layer of the PCB, and therefore do not need connections to vias. The method further comprises identifying that a third row of balls 203 and a fifth row 205 of balls cannot be escaped on the topmost layer of the PCB. Therefore, the signals from the third and fifth rows must be routed to a via for escape. Thus, the PCB grid comprises vias located opposite the fourth row 204 of the package BGA for escaping signals of the third and fifth rows 203 and 205.

The method further comprises de-populating the balls of the fourth row 204 of the package to clear space for the vias of the fourth row of the PCB, which are connected to the balls of the third row 203 and the fifth row 205. In a further example, the method also comprises placing test pads at the depopulated fourth row 204. According to this method, the vias do not interfere with the test pads of BGA 200. While example embodiments have been described in relation to a BGA, any appropriate electrical contact may be used in place of the balls of the BGA. In other embodiments the rows are part of an integrated circuit package that may include a BGA, a pin-grid array (PGA), or land-grid arrays (LGA). In other embodiments, the contacts may be pins, studs, lands, or bumps.

In a further embodiment, the third and fifth rows 203 and 205 comprise ground balls, power balls, and signal balls. In an example embodiment, the locations of the ground balls, the power balls, and the signal balls in the third and fifth rows 203 and 205 are alternated in order to increase coupling between the ground, power, and signal balls and reduce overall inductance.

While there are some known approaches in which unpopulated or depopulated areas of a package are replaced with test balls, in BGA 200, such test balls would interfere with the surface-mount components in the same way regular signal balls would interfere.

Figure 6:
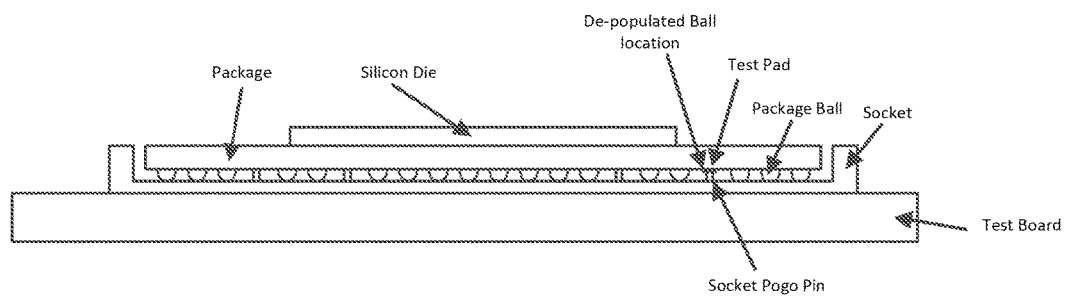
FIG. 6 is a cross-sectional view of a socketed integrated circuit package with test connection to test pad locations according to an embodiment of the present disclosure.

FIG. 6 is a cross-sectional view of an integrated circuit package in operation with a test device, according to an embodiment of the present disclosure. The example embodiment in FIG. 6 shows a test pad provided in a depopulated ball location, the test pad being used in conjunction with a test board and socket. In this example, the test pad is connected to the socket by a socket pogo pin, in order to perform testing of the integrated circuit package.

In an example embodiment, the test pads are provided in a ring-like configuration. In an example embodiment, the plurality of ball locations are arranged in a plurality of concentric annular rows, and the test pads are provided in an annular row of test pads in the plurality of concentric annular rows. In an example embodiment, the test pads occupy a subset of a plurality of ball locations in the annular row of test pads.

Figure 7:
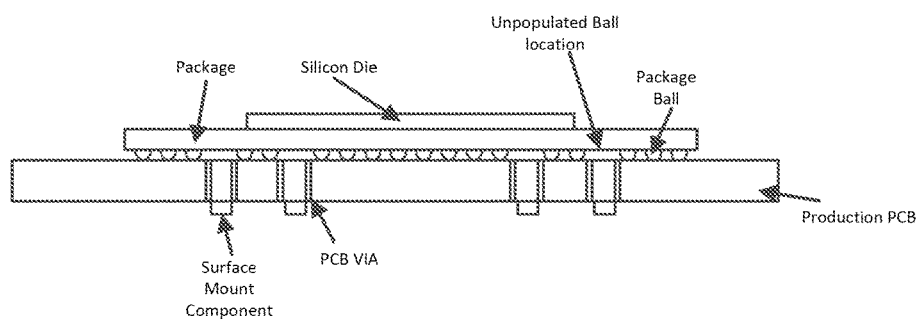
FIG. 7 is a cross-sectional view of integrated circuit package connections on a functional board with no populated connections according to an embodiment of the present disclosure.

FIG. 7 is a cross-sectional view of an integrated circuit package in operation with a PCB, according to an embodiment of the present disclosure. The example embodiment of FIG. 7 shows the de-populated ball locations cooperating to provide a de-populated inter-ball region greater than a via-facing region associated with an area of one or more PCB vias. As shown in FIG. 7, a surface mount component, such as a capacitor or resistor, can be provided on the opposite side of the PCB from the package, and connected to one or more vias.

In an embodiment, the present disclosure provides an apparatus comprising a printed circuit board (PCB) and an integrated circuit package. The PCB comprises a package-facing surface defining a regular pattern of repeating locations comprising first and second subsets of locations. The first subset of locations each comprise a contact, and the second subset of locations comprise a via area. The PCB comprises at least one via provided in one of the via areas, the via having a first end terminating at the package-facing surface. The package has a fine pitch integrated circuit package design defined with respect to a package grid on a PCB-facing surface of the package. The package grid defines a regular pattern of repeating locations comprising third and fourth subsets of locations. The third subset of locations each comprises a solder ball, and the fourth subset of locations comprise a test pad. The first and second subset of locations are located opposite the third and fourth subset of locations, respectively, when the package-facing surface of the PCB is mounted to the PCB-facing surface of the package.

Therefore, the contacts of the first subset of locations are connected to the solder balls of the third subset of locations, and the via areas of the second subset of space are disconnected from the test pads of the fourth subset of locations when the package-facing surface of the PCB is mounted to the PCB-facing surface of the package.

Alternatively, the solder balls of the third subset of locations are unconnected, while the test pads of the fourth subset of locations are connected to test pins, when the PCB-facing surface of the package is mounted in test socket according to FIG. 6.

While there are some known approaches in which test signals are located on top of a chip package due to de-populated balls in a fine pitch BGA, such a solution would not work for a package-on-package (PoP) chip package because the test signals would interfere with the package-on-package configuration. In a further embodiment, the test pads are used in a fine pitch BGA for package-on-package applications.

In an example implementation, a package comprises a combination of elements of pogo pin based testing with custom ball patterns. According to an example embodiment, the inner row of balls is removed in a specific manner to allow optimal PCB placement for filtering capacitors. Test pins, to reduce production test times, are placed in the inner ring formed by the removal and connected to through a pogo pin based socket.

In an implementation, the present disclosure provides a method of producing an integrated circuit package comprising: de-populating connection balls at selected locations in a fine pitch package; and providing test pads at the de-populated connection ball locations. In an example implementation, de-populating the balls comprises: identifying an outer row of balls connected to PCB vias, identifying an inner second row of balls connected to PCB vias, and de-populating a row of balls adjacent to both the outer and inner rows of balls. In an example implementation, providing test pads comprises placing test pads at the depopulated row.

In an implementation, the present disclosure provides an integrated circuit package comprising: a plurality of de-population locations previously populated by a solder ball; and a plurality of test pads provided at the de-populated solder ball locations.

FIG. 8 through FIG. 12 illustrate a ball array according to example embodiments of the present disclosure.

In an example embodiment, each of FIG. 4 and FIGS. 8 through 12 represents a ball grid array according to different example embodiments of the present disclosure, with later figures generally providing improved performance.

Figure 8:
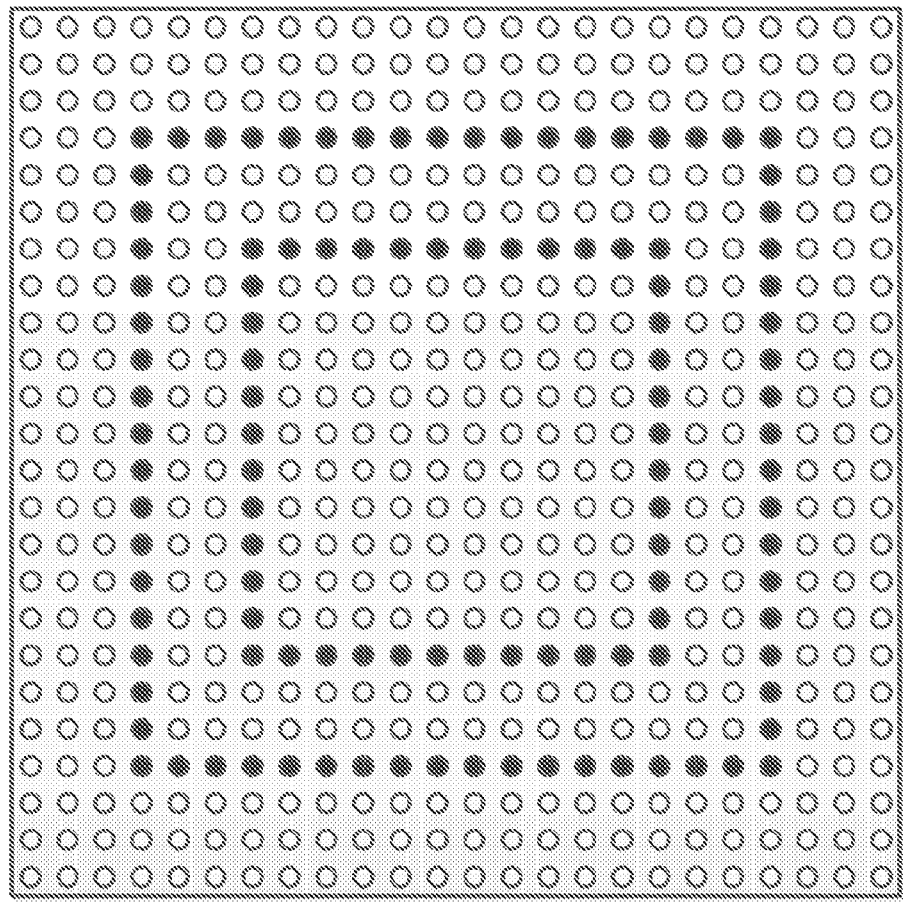
FIG. 8 illustrates an integrated circuit package including a ball array according another embodiment of the present disclosure.

In another example embodiment, FIG. 4 and FIGS. 8 through 12 show a progression of steps in a method of the invention. FIG. 8 illustrates the additional depopulation of the 7th row, in addition to depopulation on the 4th row as shown in FIG. 4. In an embodiment, some or all of the depopulated ball locations are populated with test pads. This allows more signals, power, and ground balls to escape. The vias on the 7th row of the PCB are used to escape signals from rows 6 and 8 of the PCB.

Figure 9:
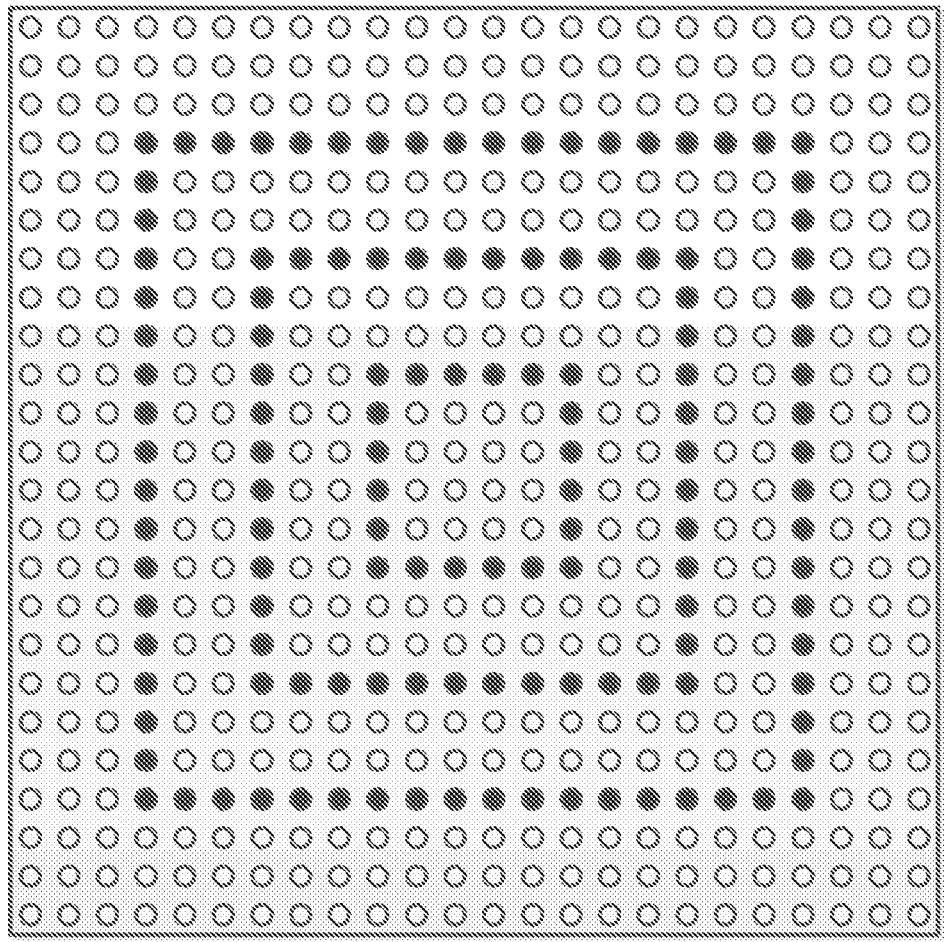
FIG. 9 illustrates an integrated circuit package including a ball array according a further embodiment of the present disclosure.

FIG. 9 illustrates further depopulating the 10th row. This continues a method according to an example embodiment of the present disclosure of depopulating every third row. In an embodiment, some or all of the depopulated ball locations are populated with test pads. The vias on the 10th row of the PCB are used to escape signals from rows 9 and 11 of the PCB.

Figure 10:
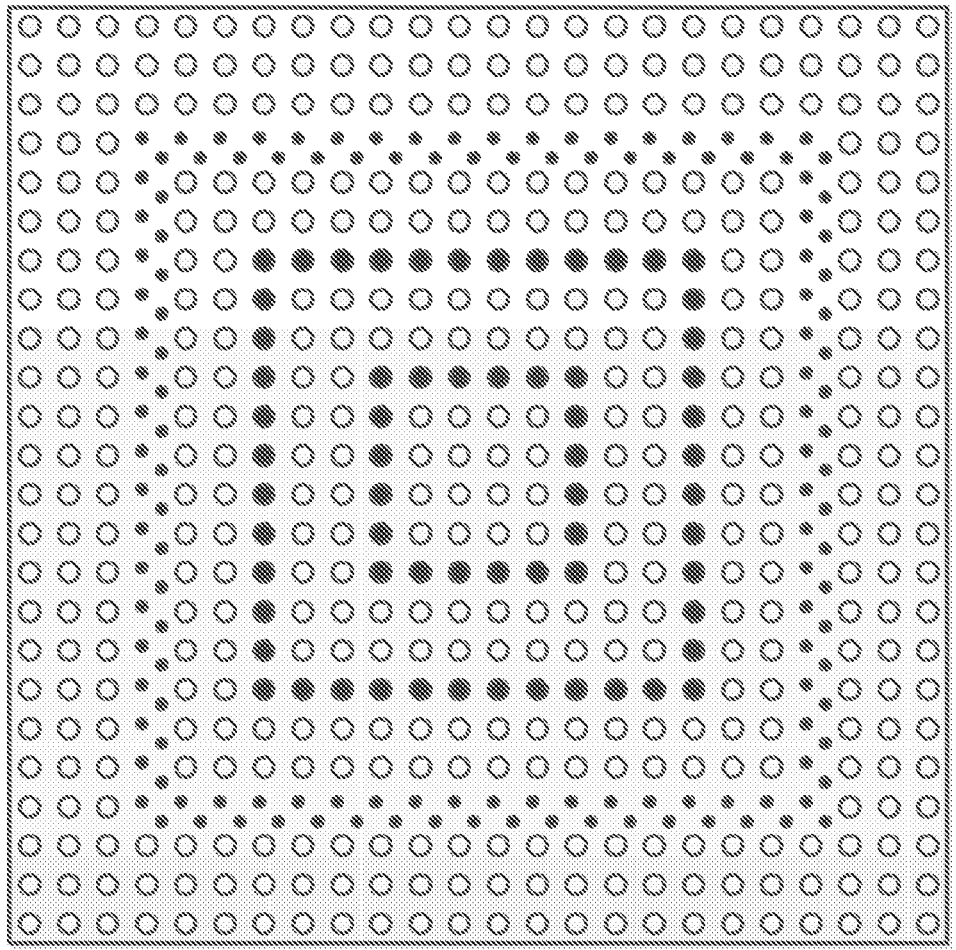
FIG. 10 illustrates an integrated circuit package including a ball array according another embodiment of the present disclosure.

FIG. 10 illustrates a probe pad with mixed/tighter pitch. This example embodiment shows that the pitch of the test pads may be tighter than the ball pitch and may have mixed pitches. In an example embodiment, the plurality of test pads in the row of test pads have a first pitch, the first pitch being different than a second pitch of the outer row of via-connected solder balls; in an embodiment, the inner row of via-connected solder balls can also have the same second pitch.

Figure 11:
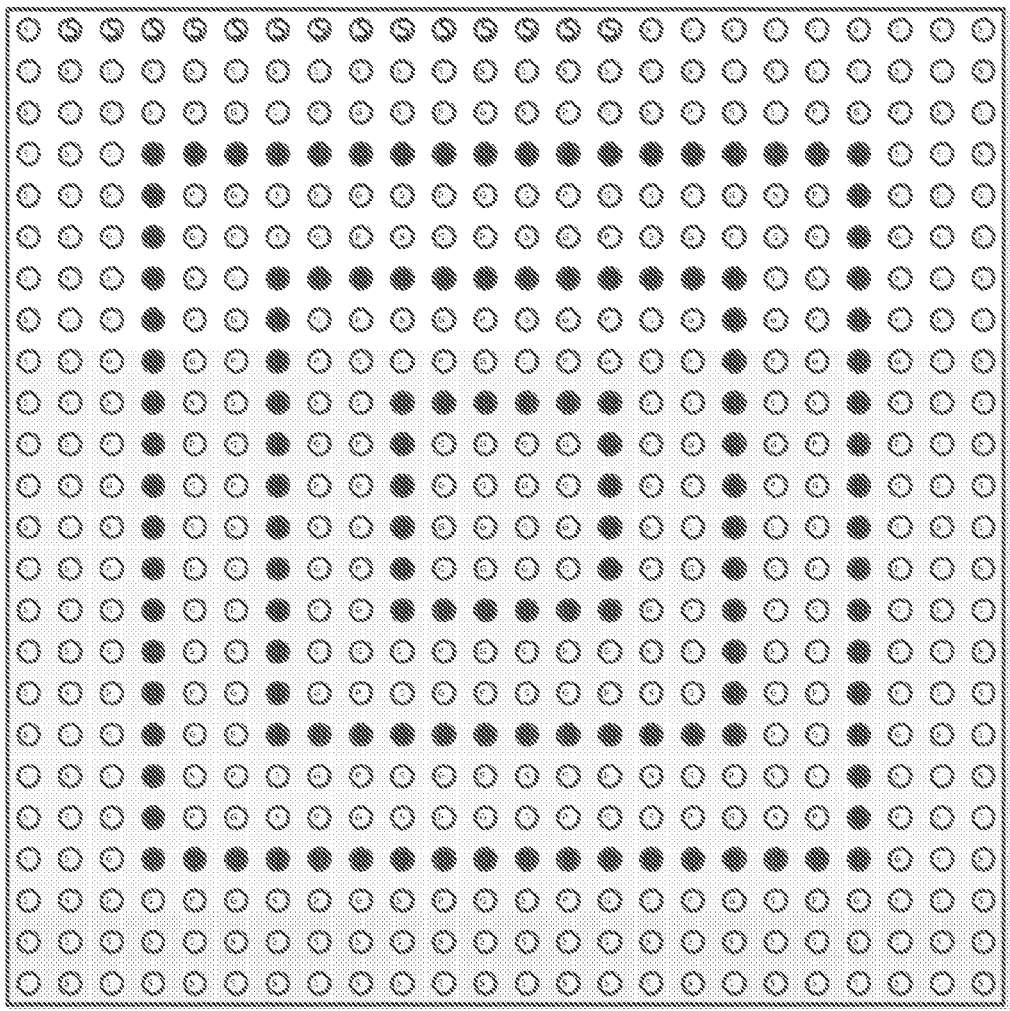
FIG. 11 illustrates an integrated circuit package including a ball array according a further embodiment of the present disclosure.

FIG. 11 illustrates an example embodiment showing specific balls as power or ground signals. The embodiment shown in FIG. 11 illustrates the implementation of a method of an embodiment of the present disclosure for populating the power, ground and signal balls for optimal signal integrity and escape routing.

Figure 12:
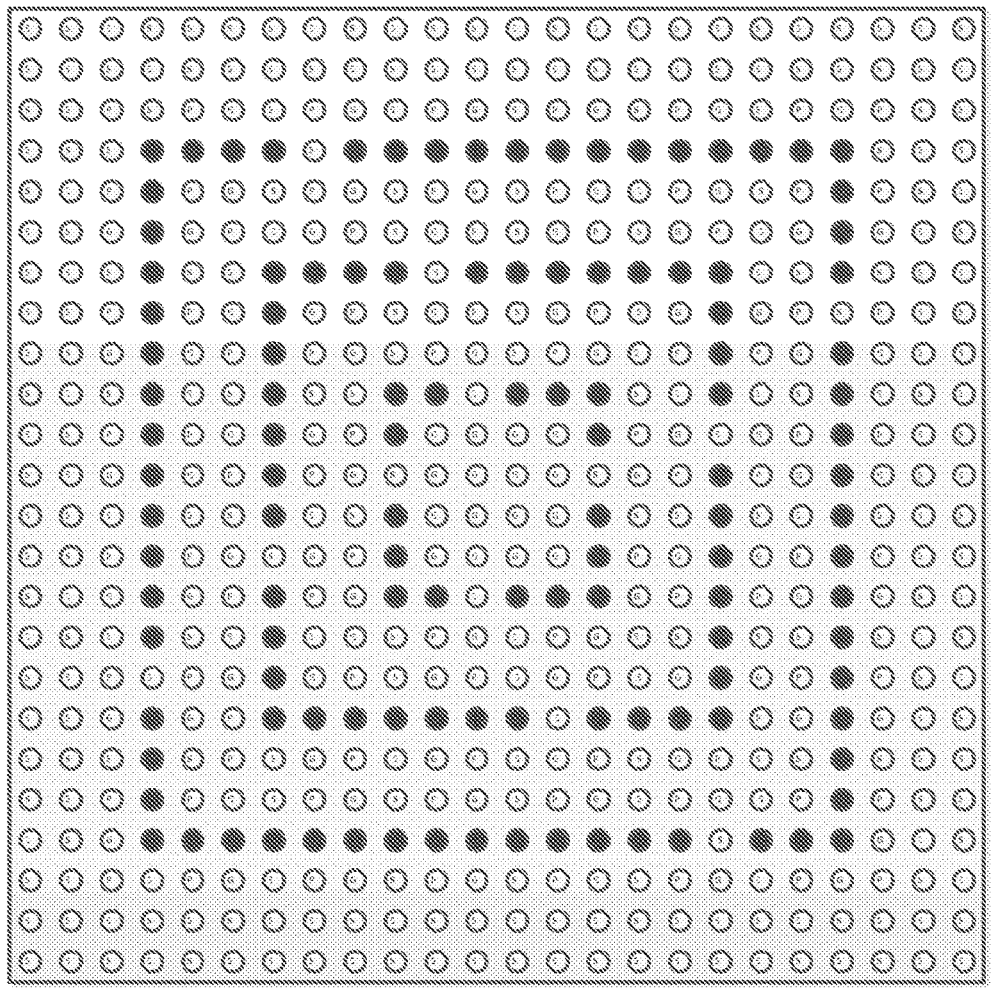
FIG. 12 illustrates an integrated circuit package including a ball array according another embodiment of the present disclosure.

FIG. 12 illustrates selective depopulation of ball locations. This example embodiment shows that one or more test pads can be provided in a subset of the former ball locations in a selected row, which has been described above as providing the test pads in a substantially ring-like configuration.

A method for depopulating a ball array according to an example embodiment of the present disclosure is provided below, the result of which can be seen in FIG. 11 and/or FIG. 12.

1) The first two rows are fully populated with signals as they can be escaped on the top PCB layer without using VIAs.

2) Given a pad pitch that does not allow PCB VIAs to be placed between balls, the fourth row is depopulated to allow escape for the third and fifth row.

3) A specific method of power, ground and signal ball placement for inner rows can be used as illustrated in FIG. 11.

a. For example, powers balls are placed next to ground balls on a given annular row in order to obtain lower inductance through close return paths.

b. The annular outer and inner rows across the depopulated row (that is filled with test pads) have power balls and ground balls that align. This configuration allows the respective power and ground balls to be connected together (across the depopulated row) on the top layer of the PCB and have one via used for both outer and inner rows of power and ground balls. This reduces the need for a one-for-one ball-to-via placement.

c. Every third ball is a signal ball. There is space to escape two signals for every one power ball and ground ball combination.

d. This pattern continues inwardly into the central core of the BGA.

e. The inner most populated balls are usually all ground balls to allow a good thermal connection but it may be possible to have the inner balls populated differently.

4) Tighter pitches on the test pads are allowed since test probes can have a higher accuracy and tolerance than those of the balls. The constraints will allow a larger number of test pads than depopulated solder balls placed in the depopulated row. This is shown, for example, in FIG. 10, and has the benefit of allowing more test signals for reducing test time and increasing test coverage.

In another embodiment comprising different PCB routing rules, further optimizations are achieved by adding solder balls into the test pad rows depending on the specific signal count of the design. FIG. 12 illustrates an example of how this can be achieved.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

What is claimed is:

1. An integrated circuit package having a fine pitch integrated circuit package design defined with respect to a grid having a plurality of ball locations arranged in a plurality of concentric annular rows, the integrated circuit package for connecting to a printed circuit board, and the package comprising:
- an outer row of via-connected solder balls in the plurality of concentric annular rows;
- a first inner row of via-connected solder balls in the plurality of concentric annular rows;
- a row of test pads in the plurality of concentric annular rows, the row of test pads comprising a plurality of test pads, the row of test pads being adjacent the outer row of via-connected solder balls to define a first inter-row region between the outer row of via-connected solder balls and the row of test pads, the row of test pads also being adjacent the first inner row of via-connected solder balls to define a second inter-row region between the first inner row of via-connected solder balls and the row of test pads; and,
- a second inner row of via-connected solder balls in the plurality of concentric annular rows, the second inner row being adjacent the first inner row in a direction opposite the row of test pads to define a third inter-row region between the first and second inner rows of via-connected solder balls,
- the first, second and third inter-row regions each having a substantially equal annular thickness, and
- the outer and inner rows of via-connected solder balls each connected to vias of the printed circuit board when the package is connected to the printed circuit board.

2. The integrated circuit package of claim 1, wherein a test pad of the row of test pads is opposite a location of one or more vias located on the printed circuit board when the package is connected to the printed circuit board.

3. The integrated circuit package of claim 1 wherein the row of test pads further comprises at least one via-connected solder ball.

4. The integrated circuit package of claim 1 wherein the row of test pads further comprises at least one power, signal, or ground ball.

5. The integrated circuit package of claim 1 wherein the row of test pads further comprises at least one de-populated ball location.

6. The integrated circuit package of claim 1 wherein the row of test pads in the plurality of concentric annular rows comprises a square box.

7. The integrated circuit package of claim 1 wherein the row of test pads in the plurality of concentric annular rows comprises a rectangular box.

8. The integrated circuit package of claim 1 wherein the plurality of test pads are provided in a ring-like configuration.

9. The integrated circuit package of claim 1 wherein the plurality of test pads in the row of test pads have a first pitch different than a second pitch of the outer and inner rows of via-connected solder balls.

10. The integrated circuit package of claim 1 wherein the plurality of concentric annular rows comprises first, second, third, fourth and fifth rows,
- the first row being closest to an outer perimeter of the integrated circuit package, and the second, third, fourth and fifth rows being increasingly farther from the outer perimeter of the package,
- the first and second rows each comprising a plurality of signal balls,
- the fourth row comprising the row of test pads;
- the third row comprising the outer row of via-connected solder balls; and
- the fifth row comprising the first inner row of via-connected solder balls.

\* \* \* \* \*